(12) United States Patent (10) Patent No.: US 12,663,473 B2

Pandzic et al. (45) Date of Patent: Jun. 23, 2026

---

(54) METHOD FOR EXPERIMENTAL DETERMINATION OF BATTERY PARAMETERS AND THEIR USE

(71) Applicant: SVEUCILISTE U ZAGREBU FAKULTET ELEKTROTEHNIKE I RACUNARSTVA, Zagreb (HR)

(72) Inventors: Hrvoje Pandzic, Zagreb (HR); Vedran Bobanac, Zagreb (HR); Hrvoje Basic, Zagreb (HR)

(73) Assignee: SVEUCILISTE U ZAGREBU FAKULTET ELEKTROTEHNIKE I RACUNARSTVA, Zagreb (HR)

( * ) Notice: Subject to any disclaimer, the term of this patent is extended or adjusted under 35 U.S.C. 154(b) by 380 days.

(21) Appl. No.: 18/236,953

(22) Filed: Aug. 23, 2023

(65) Prior Publication Data

US 2024/0027530 A1 Jan. 25, 2024

Related U.S. Application Data

(63) Continuation of application No. PCT/EP2022/070718, filed on Jul. 23, 2022.

(51) Int. Cl.
*G01R 31/367* (2019.01)
*G01R 31/387* (2019.01)
*G01R 31/392* (2019.01)

(52) U.S. Cl.
CPC ......... *G01R 31/367* (2019.01); *G01R 31/387* (2019.01); *G01R 31/392* (2019.01)

(58) Field of Classification Search
CPC ... G01R 31/367; G01R 31/387; G01R 31/392
See application file for complete search history.

(56) References Cited

U.S. PATENT DOCUMENTS

2016/0187426 A1* 6/2016 Delaplagne ......... H01M 10/441
429/93
2021/0311129 A1* 10/2021 Yezerets .............. G01R 31/385

FOREIGN PATENT DOCUMENTS

CN 111273177 A 6/2020
CN 113125967 A 7/2021
(Continued)

OTHER PUBLICATIONS

Bonanc et al "Determining Lithium-ion Battery one-way Energy Efficiencies: Influence of C-rate and Coulombic Losses" IEEE EUROCON-2021, 19th International Conference on Smart Technologies, Jul. 6-8, 2021, pp. 385-389 (Year: 2021).*
(Continued)

*Primary Examiner* — Catherine T. Rastovski
*Assistant Examiner* — Sharad Timilsina
(74) *Attorney, Agent, or Firm* — XSENSUS LLP

(57) ABSTRACT

A method for determination of battery parameters comprises the following steps: the determination of multiple roundtrip battery for a number of different pairs of charging and efficiencies discharging battery C-rates/P-rates, solving a nonlinear optimisation problem to obtain one-way efficiencies, and finding a charging and discharging characteristics for selected charging and discharging C-rates/P-rates. The obtained characteristic curves can reveal the actual current/power that is charged/discharged into/from the battery when the battery is charged/discharged with selected current/power from/to an external source/sink. The characteristic charging/discharging curves used can be for determination of battery charge capacity, battery energy capacity, state-of-charge (SOC), state-of-energy (SOE), state-of-health (SOH), and other battery parameters.

12 Claims, 2 Drawing Sheets

(56) References Cited

FOREIGN PATENT DOCUMENTS

| WO | 2011/000872 A1 | 1/2011 |
| WO | 2013/175005 A1 | 11/2013 |
| WO | 2018/084939 A1 | 5/2018 |

OTHER PUBLICATIONS

International Search Report and Written Opinion mailed on Mar. 17, 2023, received for PCT Application PCT/EP2022/070718, filed on Jul. 23, 2022, 13 pages.

Mamadou et al., "Definition of a State-of-Energy Indicator (SoE) for Electrochemical Storage Devices: Application for Energetic Availability Forecasting", Journal of The Electrochemical Society, vol. 159, No. 8, Jul. 20, 2012, pp. A1298-A1307.

Bobanac et al., "Determining Lithium-ion Battery One-way Energy Efficiencies: Influence of C-rate and Coulombic Losses", IEEE EUROCON-2021, 19th International Conference on Smart Technologies, Jul. 6-8, 2021, pp. 385-389.

Redondo-Iglesias et al., "Efficiency Degradation Model of Lithium-ion Batteries for Electric Vehicles", IEEE Transactions on Industry Applications, vol. 55, No. 2, 2018, pp. 1932-1940.

* cited by examiner

METHOD FOR EXPERIMENTAL DETERMINATION OF BATTERY PARAMETERS AND THEIR USE

CROSS-REFERENCE TO RELATED APPLICATION(S)

The present application is a continuation of International Patent Application No. PCT/EP2022/070718, filed Jul. 23, 2022, wherein the contents and disclosure of which are hereby incorporated by reference in their entirety.

TECHNICAL FIELD

The present disclosure is directed to methods for determination (e.g., experimental determination) of battery parameters and their use for SOE (State of Energy), SOC (State of Charge), and/or SOH (State of Health) calculations, as examples, for the given battery.

STATE OF THE ART

For numerous reasons, even historical one, a SOC vector or values may be used in the battery management more than a SOE vector. Perhaps, SOE vector was first reported and defined in reference 1), in a coherent manner:

1) Mamadou, K., Lemaire, E., Delaille, A., Riu, D., Hing, S. E., & Bultel, Y. (2012). Definition of a State-of-Energy Indicator (SoE) for Electrochemical Storage Devices: Application for Energetic Availability Forecasting. Journal of the Electrochemical Society, 159 (8), A1298-A1307. doi: 10.1149/2.075208jes References 2) and 3) use more or less the same technique for the SOE vector determination:

2) PCT patent application published as WO2011/000872A1 for the invention METHOD FOR CALIBRATING AN ELECTROCHEMICAL BATTERY, invented by Mamadou, K. et al., subsequently granted as the European patent EP2449392B1 and the U.S. Pat. No. 9,075,117.

3) PCT patent application published as WO2013/175005A1 for the invention DEVICE AND METHOD FOR DETERMINING A POWER STATUS ACCORDING TO DATA FROM THE PROCESSING METHOD, invented by Fernandez E. et al., subsequently granted as the European patent EP2856187B1.

Reference 4) recognises the importance of one-way efficiency of charging and discharging, providing the battery system management based on the obtained SOC vector associated with its time derivative via a non-linear model.

4) PCT patent application published as WO2018/084939A1 for the invention BATTERY SYSTEM MANAGEMENT THROUGH NON-LINEAR ESTIMATION OF BATTERY STATE OF CHARGE, invented by J. A. CRAWFORD et al., subsequently granted as several US patents.

Furthermore, reference 4) discusses the usage of the calculated model in balancing the power grid.

SUMMARY

According to an aspect of the present disclosure, a method for experimental determination of battery parameters and their use can be performed or implemented. More particularly, the method can be for experimental determination of battery one-way efficiencies for a given environmental temperature $T^E$, where the method can comprise the following steps:

A. executing a battery cycling protocol where charging and discharging are performed with an external source/sink, and where the protocol is one of a constant current (CC) mode or a constant power (CP) mode;

where at least two C charging C-rates and at least two D discharging C-rates are for the CC mode, or where at least two C charging P-rates and at least two D discharging P-rates are for the CP mode, where a selected set of all $\Omega^C = \{c_1, c_2, \ldots, c_C\}$ and $\Omega^D = \{d1, d_2, \ldots, d_D\}$ values forms C×D charge-discharge cycles for all possible $\{c,d\}$ pairs of values, and where the battery cycling is repeated J times resulting in total of C×D×J charge-discharge cycles, with the provision that:

(i) each cycle is always started with a depleted battery as the battery, (ii) each charging in the CC mode or the CP mode is terminated as soon as a declared battery high voltage limit is reached, (iii) each discharging in the CC mode or the CP mode is terminated as soon as a declared battery low voltage limit is reached, B. determining multiple roundtrip battery efficiencies $$\eta_{c,d}^{cycle}$$

for C×D different pairs of charging and discharging C-rates or P-rates defined in said step A, where for every performed cycle the roundtrip efficiency per cycle $$\eta_{c,d,j}^{cycle},$$

for selected c, d and j, is calculated:

in case of the selected CC mode, from the extracted charge $$C_{c,d,j}^{dis}$$

and the injected charge $$C_{c,d,j}^{ch}$$

into the battery:

$$\eta_{c,d,j}^{cycle} = \frac{C_{c,d,j}^{dis}}{C_{c,d,j}^{ch}}$$

where the said charges $$C_{c,d,j}^{ch} \text{ and } C_{c,d,j}^{dis}$$

are obtained by numerical integration of the time-dependant charging current $$I^{ch}_{c,d,j}(t)$$

and the discharging current $$I^{dis}_{c,d,j}(t):$$

$$C^{ch}_{c,d,j} = \int I^{ch}_{c,d,j}(t) \cdot dt$$

$$C^{dis}_{c,d,j} = \int I^{dis}_{c,d,j}(t) \cdot dt$$

where the currents $$I^{ch}_{c,d,j}(t) \text{ and } I^{dis}_{c,d,j}(t)$$

are logged during every cycle, or
   in case of the selected CP mode, from the extracted energy $$E^{dis}_{c,d,j}$$

and the injected energy $$E^{ch}_{c,d,j}$$

into the battery:

$$\eta^{cycle}_{c,d,j} = \frac{E^{dis}_{c,d,j}}{E^{ch}_{c,d,j}}$$

where the energies $$E^{ch}_{c,d,j} \text{ and } E^{dis}_{c,d,j}$$

are obtained by numerical integration of the time-dependant charging power $$P^{ch}_{c,d,j}(t)$$

and the discharging power $$P^{dis}_{c,d,j}(t):$$

$$E^{ch}_{c,d,j} = \int P^{ch}_{c,d,j}(t) \cdot dt$$

$$E^{dis}_{c,d,j} = \int P^{dis}_{c,d,j}(t) \cdot dt$$

where the powers $$P^{ch}_{c,d,j}(t) \text{ and } P^{dis}_{c,d,j}(t)$$

are logged during every cycle, and
   where the obtained roundtrip efficiencies per cycle $$\eta^{cycle}_{c,d,j}$$

are averaged by the number of repetitions J from said step A, yielding the roundtrip battery efficiencies $$\eta^{cycle}_{c,d}$$

for selected C and D values to read:

$$\eta^{cycle}_{c,d} = \frac{\sum^{J}_{j=1} \eta^{cycle}_{c,d,j}}{J}$$

C. determining one-way efficiencies from the calculated roundtrip battery efficiencies $$\eta^{cycle}_{c,d}$$

in said step B, where $$\eta^{ch}_{c} \text{ and } \eta^{dis}_{d}$$

denote one-way charging and discharging efficiencies, respectively, by solving the nonlinear optimisation problem which contains C+D unknowns and C×D equations:

$$\text{Minimize} \sum_{c \in \Omega^C} \sum_{d \in \Omega^D} s^2_{c,d}$$

subjected to the following constrains:

$$\eta^{ch}_{c} \cdot \eta^{dis}_{d} = \eta^{cycle}_{c,d} + s_{c,d} \forall \, c \in \Omega^C, d \in \Omega^D$$

$$0 \le \eta^{ch}_{c} \le 1, \forall \, c \in \Omega^C$$

$$0 \le \eta^{dis}_{d} \le 1, \forall \, d \in \Omega^D$$

wherein $s_{c,d}$ is a slack variable, and where the solution of the nonlinear optimisation problem gives $$\eta^{ch}_{c} \text{ and } \eta^{dis}_{d}$$

multiplication of which diverges from the measured efficiency $$\eta_{c,d}^{cycle}$$

the least for every selected {c,d} pair of values.

DESCRIPTION OF FIGURES

Embodiments of the present disclosure are depicted in FIGS. 1A, 1B, 2A, and 2B.

Figure 2A:
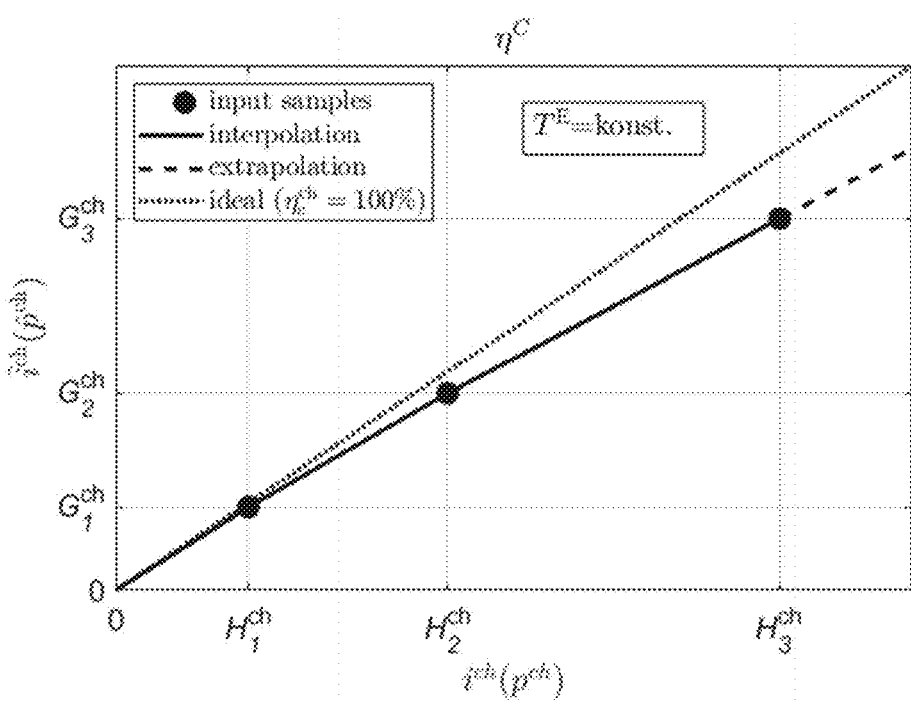

measured and calculated in three points (C=3), for the given environmental temperature $T^E$ vs. gross current (power) taken from an external source $i^{ch}$ ($p^{ch}$), corresponding to the selected charging C-rate (P-rate), denoted as a set of $$H_c^{ch}$$

values in FIG. 2A.

Figure 1A:
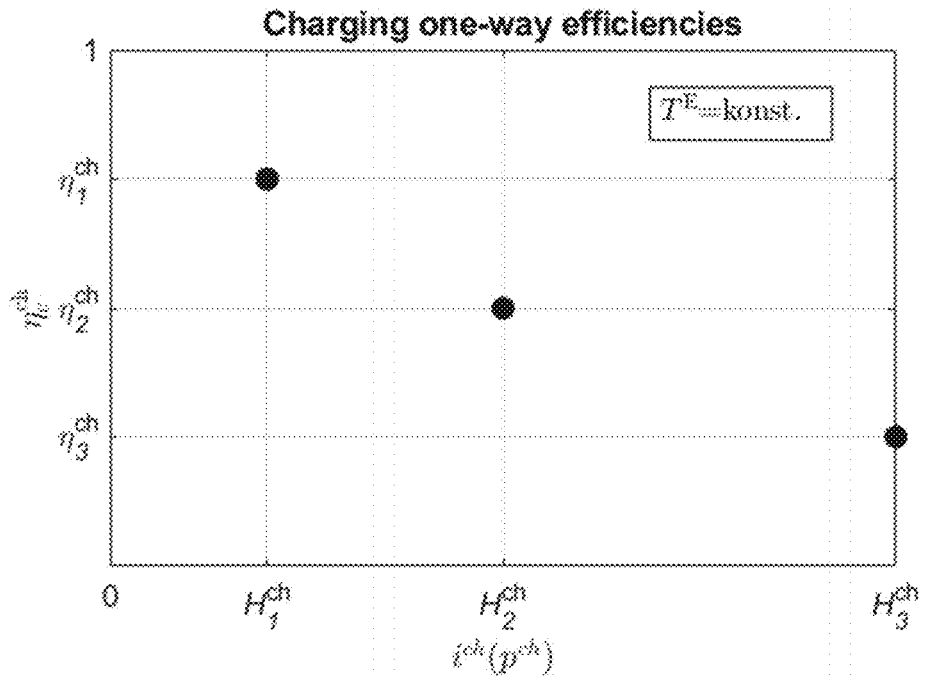
FIG. 1A shows charging one-way efficiencies $$\eta_c^{ch},$$
Figure 1B:
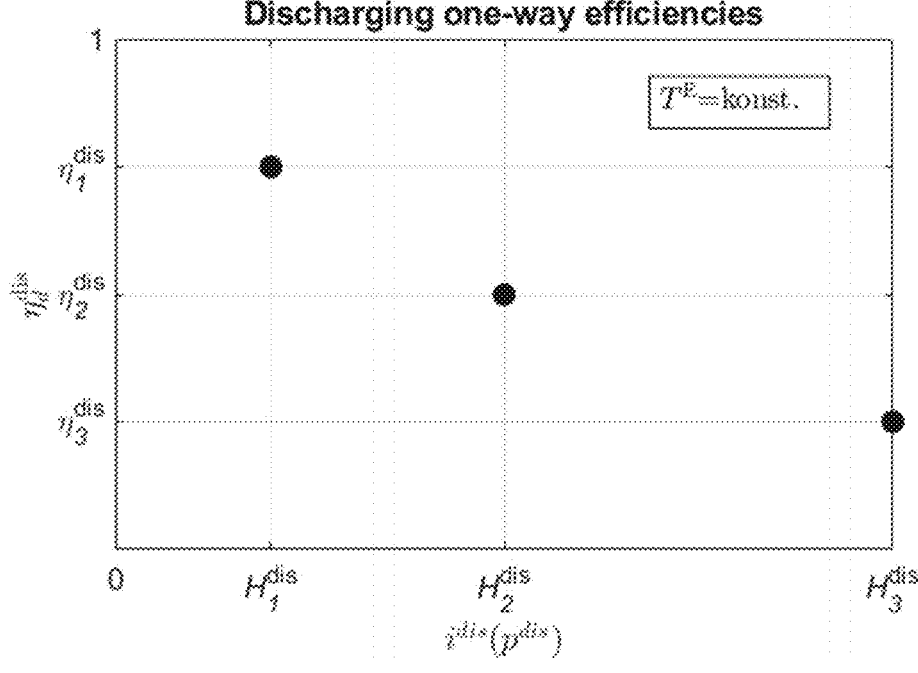
Figure 2B:
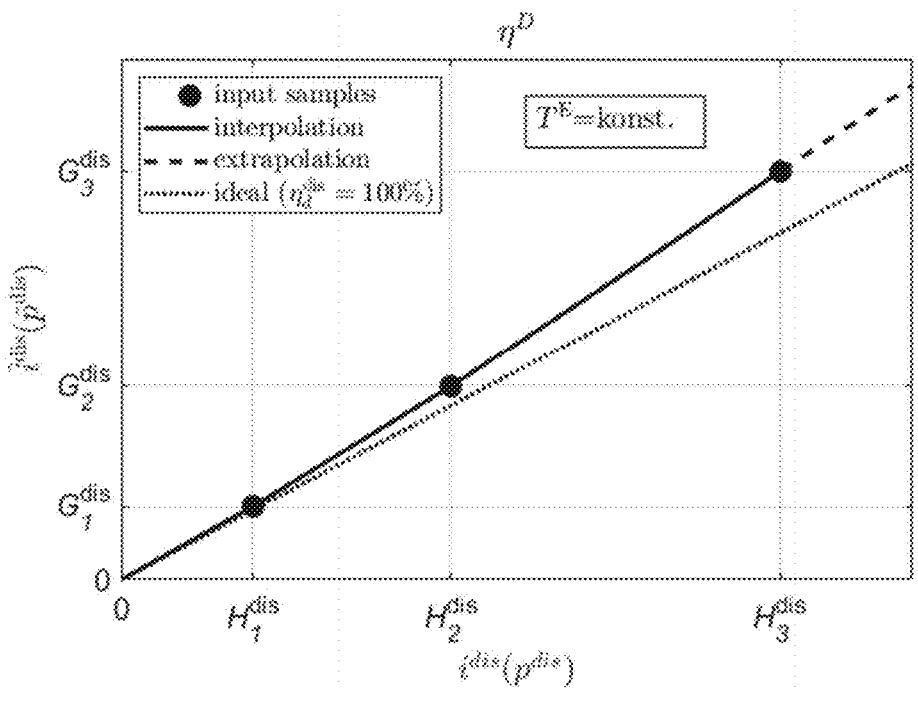

FIG. 1B shows discharging one-way efficiencies $$\eta_d^{dis},$$

measured and calculated in three points (D=3), for the given environmental temperature $T^E$ vs. net current (power) delivered to an external sink $i^{dis}$ ($p^{dis}$), corresponding to the selected discharging C-rate (P-rate), denoted as a set of $$H_d^{dis}$$

values in FIG. 2B.

FIG. 2A represents a piecewise linear efficiency charging characteristic $\eta^C$, obtained via interpolation and extrapolation from input measured data and recalculated according to the proposed model. The $\eta^C$ function connects $$G_c^{ch} \text{ and } H_c^{ch} \text{ values, where } G_c^{ch}$$

values denote $$i^{ch} \ (\hat{p}^{ch})$$

which represents the net current (power) injected in the battery during charging, to read $$G_c^{ch} = \eta_c^{ch} \cdot H_c^{ch}.$$

FIG. 2B represents a piecewise linear efficiency discharging characteristic $\eta^D$, obtained via interpolation or extrapolation from input measured data and recalculated according to the proposed model. The $\eta^D$ function connects $$G_d^{dis} \text{ and } H_d^{dis} \text{ values, where } G_d^{dis}$$

values denote $$i^{dis} \ (\hat{p}^{dis})$$

which represents a gross current (power) extracted from the battery during discharging, to read $$G_d^{dis} = H_d^{dis} / \eta_d^{dis}.$$

DETAILED DESCRIPTION

As noted above, the present disclosure reveals a novel method for determination (e.g., experimental determination) of battery parameters and their use for SOE (State of Energy), SOC (State od Charge), and/or SOH (State of Health) calculations, as examples, for the given battery. The present disclosure can also involve the subsequent use of the mentioned values in everyday battery applications. Therefore, a technical field of one or more embodiments of the present disclosure can be regarded as arrangement for testing electrical properties, more particularly, for testing, measuring, or monitoring the electrical conditions of accumulators or electric batteries, with the use of hardware and/or software.

Technical Problem

Advances in the power electronics that convert DC power to AC have helped make battery storage systems increasingly reliable. Recent breakthroughs in advanced battery energy storage have shown the ability to deliver 5,000 to 10,000 charge/discharge cycles, or more. Advanced battery systems that trim daily peaks, requiring at least 365 cycles per year, could last more than 10 years and perhaps up to 30 years. In addition, there is a growing need for advanced batteries to store wind energy produced primarily during off-peak hours, and solar energy produced during shoulder hours, for subsequent on-peak consumption. These renewable applications will require 200 to 300 cycles per year. Also, when the renewables are not available, the battery could be used for arbitrage, buying low-cost energy at night and selling it during periods of high energy price, adding another 100 to 200 cycles per year. For all of the above said reasons, the determination of battery parameters is a must for a reliable usage once installed as a part of a power grid.

A technical problem, among one or more technical problems, solved with one or more embodiments of the present disclosure is a method for experimental determination of battery one-way efficiencies for a given environmental temperature $T^E$, where the term "one-way efficiency" refers to charging or discharging battery efficiency only. The disclosed method is equally well applied to battery cycling protocol when subjected to the constant current (CC) or the constant power (CP) mode.

The calculated one-way efficiencies in CC mode can be subsequently used for determination of state-of-charge SOC vector and calculated one-way efficiencies in CP mode are used for determination of state of energy SOE vectors, respectively. Furthermore, SOC or SOE vectors can be used for determination of state-of-health SOH for the given battery, through the change of the determined battery charge capacity $C^I$ or determined battery energy capacity $C^E$ in time.

From the above, one-way efficiency characteristics for the CC mode and the CP mode can be calculated, such as set forth in the detailed description section.

In a first embodiment, a method for modelling battery one-way efficiency characteristics in the CC mode can be used for determination of the state-of-charge SOC vector. In one variant, the method can be used for experimental determination of battery charge capacity $C^I$. In yet another variant, the one-way efficiency characteristics can be used for determination of the state-of-health SOH parameter expressed in percentage 0-100%, via the change of battery charge capacity $C^I$ in time.

In another embodiment, the method for modelling battery one-way efficiency characteristics in the CP mode can be used for determination of the state-of-energy SOE vector. In one variant, the method can be used for experimental determination of battery energy capacity $C^E$. In yet another variant, the one-way efficiency characteristics can be used for determination of the state-of-health SOH parameter expressed in percentage 0-100%, via the change of battery energy capacity $C^E$ in time.

Embodiments of the present disclosure can involve or implement a method for experimental determination of battery parameters and their use for SOE (State of Energy), SOC (State od Charge) and/or SOH (State of Health) calculations for the given battery, as noted earlier.

Regarding the above, for instance, battery characteristics can depend on environmental temperature $T^E$. So, one or more embodiments of the present disclosure can implement the method executed at given environmental temperature $T^E$. According to one or more embodiments, the determination (e.g., experimental determination) of battery parameters can comprise or consist of the steps or operations described below.

Step A

In step A, it may be desirable to execute a battery cycling protocol by performing measurements (e.g., experimental measurements). Battery cycling protocol can be regarded as a protocol where charging and discharging are performed with an external source/sink. This can involve use of (e.g., selection of) either the constant current (CC) cycling mode or the constant power (CP) cycling mode. To perform the measurements, the following equipment can be used, as examples:

(i) Professional bi-directional DC power supply Itech IT-M3413, coupled with a proprietary NI LabVIEW software for control and supervision of battery experiments. Characteristics of the bi-directional DC power supply can be as follows:

Output DC Voltage: from 0 to 150 V

−Setup Resolution: 1 mV

8

-continued

−Accuracy: $< 0.1 \cdot U_{max}$

Outup DC Current: from $-12\ A$ to $12\ A$

−Setup Resolution: 1 mA

−Accuracy: $< 0.1 \cdot I_{max} + 0.1\% \cdot I_{current}$

Output Power: from $-200$ W to $200$ W

−Setup Resolution: 0.1 W

−Accuracy: $< 0.1 \cdot P_{max}$ (ii) Commercial battery cells:
   NMC (lithium-nickel-manganese-cobalt-oxide) 18650
      Declared nominal capacity: 3000 mAh
      Declared nominal voltage: 3.6V
   LFP (lithium-iron-phosphate) 18650
      Declared nominal capacity: 1500 mAh
      Declared nominal voltage: 3.2V
   LCO (lithium-cobalt-oxide) 18650
      Declared nominal capacity: 3200 mAh
      Declared nominal voltage: 3.75V
   LTO (lithium-titanate) 18650
      Declared nominal capacity: 1300 mAh
      Declared nominal voltage: 2.75V.

For the proper execution, at least two C charging C-rates and at least two D discharging C-rates can be used or implemented (e.g., selected) for the CC mode. Each selected C-rate can denote the measure of the rate at which a battery charges or discharges under constant current relative to its declared charge capacity, usually expressed in Ampere hours, i.e., Ah units. Similarly, at least two C charging P-rates and at least two D discharging P-rates can be used or implemented (e.g., selected) for the CP mode. Hereby, each selected P-rate can denote the measure of the rate at which a battery charges or discharges under constant power relative to its declared energy capacity, usually expressed in Watt hours, i.e., Wh units.

The selected set of all $$\Omega^C = \{c_1, c_2, \ldots, c_C\} \text{ and } \Omega^D = \{d_1, d_2, \ldots, d_D\}$$

values can form C×D charge-discharge cycles for all possible {c,d} pairs of values. For increasing the model's accuracy, the above cycling can be repeated J times resulting in total of C×D×J charge-discharge cycles. According to one or more embodiments, it can be desirable for J to be greater than 1 for improving accuracy, for example, but the model can be run even for J=1. Each cycle can fulfil the following conditions (i)-(iii) set below:

(i) each cycle can be always started with a depleted battery, where depleted can mean that a non-depleted battery is discharged until the battery's low voltage limit has been reached with the provision that the discharging battery C-rate or P-rate is equal to the cycle's discharging C-rate or P-rate in step (iii), which can ensure the same starting and finishing point of the cycle in terms of currents and voltages, (ii) each charging in the CC mode or the CP mode can be terminated as soon as the declared battery high voltage limit is reached, and (iii) each discharging in CC mode or CP mode can be terminated as soon as the declared battery low voltage limit is reached.

The mentioned battery low/high voltage limits, which are usually declared by the manufacturer or by the used battery management system, can protect the battery from an irreversible damage.

Possibly simpler and/or less time consuming variation of the above conditions (i)-(iii) can be to relax the cycle's starting point stated in (i), so that the battery can be discharged to its low voltage limit with any C-rate or P-rate. This can mean that the starting and finishing point of the cycle (ii)-(iii) may not be exactly the same in terms of measured currents and voltages.

The above stated cycling conditions (i)-(iii) may be intended for charging/discharging between the battery voltage limits, which can correspond to the widest possible SOC range in which CC or CP mode can be maintained. However, one or more embodiments of the present disclosure can alternatively or additionally cycle the battery in some arbitrary, narrower SOC range, provided that SOC can be determined accurately and consistently, and that each charging/discharging cycle can be performed over the same SOC range while maintaining either CC or CP mode during the entire cycle.

Step B

During battery charging or discharging, a part of the energy is converted into the pure Joule heat and a part may be lost in the electrochemical processes as well, as described in reference 5)

5) Gatta, F. M., Geri, A., Lauria, S., Maccioni, M., & Palone, F. (2015). Battery energy storage efficiency calculation including auxiliary losses: Technology comparison and operating strategies. 2015 IEEE Eindhoven PowerTech. doi: 10.1109/ptc. 2015.7232464

A method, according to one or more embodiments of the present disclosure, the determination of multiple roundtrip battery efficiencies $$\eta_{c,d}^{cycle},$$

for C×D different pairs of charging and discharging C-rates or P-rates defined in step A, can be performed.

For every performed cycle, the roundtrip efficiency per cycle $$\eta_{c,d,j}^{cycle},$$

for selected c, d and j, can be calculated as described below.

In case of the selected CC mode, from the extracted charge $$C_{c,d,j}^{dis}$$

and the injected charge $$C_{c,d,j}^{ch}$$

into the battery, the roundtrip efficiency per cycle $$\eta_{c,d,j}^{cycle}$$

can be calculated according to the formula:

$$\eta_{c,d,j}^{cycle} = \frac{C_{c,d,j}^{dis}}{C_{c,d,j}^{ch}}$$

The charges $$C_{c,d,j}^{ch} \text{ and } C_{c,d,j}^{dis}$$

can be obtained by numerical integration of the time-dependant charging current $$I_{c,d,j}^{ch}(t)$$

and the discharging current $$I_{c,d,j}^{dis}(t): \quad \begin{aligned} C_{c,d,j}^{ch} &= \int I_{c,d,j}^{ch}(t) \cdot dt \\ C_{c,d,j}^{dis} &= \int I_{c,d,j}^{dis}(t) \cdot dt \end{aligned}$$

It should be noted that the currents $$I_{c,d,j}^{ch}(t) \text{ and } I_{c,d,j}^{dis}(t)$$

can be logged by an external device or by an appropriate converter itself during every cycle.

Similarly, in case of the selected CP mode, from the extracted energy $$E_{c,d,j}^{dis}$$

and the injected energy $$E_{c,d,j}^{ch}$$

into the battery, the roundtrip efficiency per cycle $$\eta_{c,d,j}^{cycle}$$

can be calculated according to the formula:

$$\eta_{c,d,j}^{cycle} = \frac{E_{c,d,j}^{dis}}{E_{c,d,j}^{ch}}$$

The energies $$E_{c,d,j}^{ch} \text{ and } E_{c,d,j}^{dis}$$

can be obtained by numerical integration of the time-dependant charging power $$P_{c,d,j}^{ch}(t)$$

and the discharging power $$P_{c,d,j}^{dis}(t):$$

$$E_{c,d,j}^{ch} = \int P_{c,d,j}^{ch}(t) \cdot dt$$
$$E_{c,d,j}^{dis} = \int P_{c,d,j}^{dis}(t) \cdot dt$$

It should be noted that the powers $$P_{c,d,j}^{ch}(t) \text{ and } P_{c,d,j}^{dis}(t)$$

can be logged by an external device or by an appropriate converter itself during every cycle.

Once the obtained roundtrip efficiencies per cycle $$\eta_{c,d,j}^{cycle}$$

are obtained in the desired mode, i.e., CC or CP mode, an averaging can occur for the same repetitive runs. The measured and calculated roundtrip efficiencies per cycle $$\eta_{c,d,j}^{cycle}$$

can be averaged over the number of repetitions J from step A, which can yield the roundtrip battery efficiencies $$\eta_{c,d}^{cycle}$$

for selected C and D values to read:

$$\eta_{c,d}^{cycle} = \frac{\sum_{j=1}^{J} \eta_{c,d,j}^{cycle}}{J}$$

The roundtrip battery efficiencies $$\eta_{c,d}^{cycle}$$

can be regarded as the values that reflect historical efficiency for battery cycling data, i.e., for particular {c,d} pairs of values. This value may not necessarily be of particular use because the charging and discharging data can be incorporated therein.

Step C

According to one or more embodiments, the method can include calculation of the one-way battery efficiencies, one-way charging efficiencies $$\eta_c^{ch}$$

and/or one-way discharging efficiencies $$\eta_d^{dis}$$

from the set of roundtrip battery efficiencies $$\eta_{c,d}^{cycle}$$

measured and calculated in step B.

This can lead to the nonlinear optimisation problem which contains C+D unknowns and C×D equations:

$$\text{Minimize} \sum_{c \in \Omega^C} \sum_{d \in \Omega^D} s_{c,d}^2$$

subjected to the following constrains:

$$\eta_c^{ch} \cdot \eta_d^{dis} = \eta_{c,d}^{cycle} + s_{c,d} \, \forall \, c \in \Omega^C, d \in \Omega^D$$

$$0 \le \eta_c^{ch} \le 1, \, \forall \, c \in \Omega^C$$

$$0 \le \eta_d^{dis} \le 1, \, \forall \, d \in \Omega^D$$

wherein $s_{c,d}$ is a slack variable. The solution of the above optimisation problem can give $$\eta_c^{ch} \text{ and } \eta_d^{dis}$$

multiplication of which diverges from the measured efficiency $$\eta_{c,d}^{cycle}$$

the least—for every selected {c,d} pair of values. It is noted that the following assumption can be used:

$$\eta_C^{ch} \cdot \eta_d^{dis} = \eta_{c,d}^{cycle}.$$

Once the one-way charging efficiencies $$\eta_c^{ch}$$

and one-way discharging efficiencies $$\eta_d^{dis}$$

for all measured/selected {c,d} pairs are known, the battery can be mapped (e.g., fully and/or partially) and the results can be regarded as ready to be used for everyday battery operation. FIG. 1A shows charging one-way efficiencies $$\eta_c^{ch},$$

measured and calculated in three points, for the given environmental temperature $T^E$ vs. gross current (power) taken from the external source $i^{ch}$ ($p^{ch}$) corresponding to the selected charging C-rate (P-rate). FIG. 1B shows discharging one-way efficiencies $$\eta_d^{dis},$$

measured and calculated in three points, for the given environmental temperature $T^E$ vs. net current (power) delivered to the external sink $i^{dis}$ ($p^{dis}$) corresponding to the selected discharging C-rate (P-rate).

Practical applications of the one-way efficiencies $$\eta_c^{ch} \text{ and } \eta_d^{dis}$$

are discussed in the following examples.

Example 1—Determination of State-of-Charge SOC Vector

If the battery cycling was performed in the CC mode, the obtained one-way efficiencies $$\eta_c^{ch} \text{ and } \eta_d^{dis}$$

can be used to determine the state-of-charge SOC vector. The procedure is explained in more detail below.

Previously calculated charging $$\eta_c^{ch}$$

and discharging $$\eta_d^{dis}$$

efficiencies in step C for the given battery can be used for defining piecewise linear efficiency characteristics $\eta^C$ and $\eta^D$ for the range of battery's operational charging/discharging C-rates.

The efficiency characteristics can be defined as:

$$\hat{i}^{ch} = \eta^C(i^{ch}) \text{ and } \hat{i}^{dis} = \eta^D(i^{dis})$$

where $\hat{i}^{ch}$ is a net current injected in the battery during charging and it is function of the gross current taken from the external source $i^{ch}$, while gross current extracted from the battery during discharging $\hat{i}^{dis}$ is a function of the net current delivered to the external sink $i^{dis}$.

The functions $\eta^C$ and $\eta^D$ can be obtained as interpolations or extrapolations performed for the measured currents $i^{ch}$, $i^{dis}$ values in respect to the known currents used in battery cycling in step A. Although many different methods can be used for reconstruction of $\eta_C$ and $\eta^D$ as continuous functions, e.g., spline reconstruction or similar, the present disclosure will use a piecewise linear interpolation, which turns to be sufficiently accurate for the desired task.

To perform the desired tasks, some changes in notation can be applied to read the same regardless of the used mode, i.e., CC or CP mode. In the CC mode, $$H_c^{ch}$$

represents a selected c charging value $$i_c^{ch}$$

of C-rates from step A and $$G_c^{ch}$$

its corrected value $$\hat{i}_c^{ch}$$

for the one-way charging efficiency $$\eta_c^{ch}$$

obtained from step C:

$$G_c^{ch} = \eta_c^{ch} \cdot H_c^{ch}, \forall c \in \Omega^C.$$

Similarly, $$H_d^{dis}$$

represents a selected d discharging value $$i_d^{dis}$$

of C-rates from step A and $$G_d^{dis}$$

its corrected value $$\hat{i}_d^{dis}$$

for the discharging efficiency $$\eta_d^{dis}$$

obtained in step C:

$$G_d^{dis} = \frac{H_d^{dis}}{\eta_d^{dis}}, \; \forall \, d \in \Omega^D.$$

Now, the interpolations and extrapolations read:

$$\eta^C(i^{ch}) = \begin{cases} \dfrac{G_1^{ch}}{H_1^{ch}} \cdot i^{ch}, \text{ if } i^{ch} \le H_1^{ch} \\[2mm] G_c^{ch} + \dfrac{G_{c+1}^{ch} - G_c^{ch}}{H_{c+1}^{ch} - H_c^{ch}} \cdot (i^{ch} - H_c^{ch}), \text{ if } H_c^{ch} < i^{ch} \le H_{c+1}^{ch}, \\[2mm] \qquad\qquad \text{for } c = 1, 2 \, \dots \, C - 1 \\[2mm] G_c^{ch} + \dfrac{G_c^{ch} - G_{c-1}^{ch}}{H_c^{ch} - H_{c-1}^{ch}} \cdot (i^{ch} - H_c^{ch}), \text{ if } H_c^{ch} < i^{ch}, \text{ for } c = C \end{cases}$$

and $$\eta^D(i^{dis}) = \begin{cases} \dfrac{G_1^{dis}}{H_1^{dis}} \cdot i^{dis}, \text{ if } i^{dis} \le H_1^{dis} \\[2mm] G_d^{dis} + \dfrac{G_{d+1}^{dis} - G_d^{dis}}{H_{d+1}^{dis} - H_d^{dis}} \cdot (i^{dis} - H_d^{dis}), \\[2mm] \quad \text{if } H_d^{dis} < i^{dis} \le H_{d+1}^{dis}, \text{ for } d = 1 \, \dots \, D - 1 \\[2mm] G_d^{dis} + \dfrac{G_d^{dis} - G_{d-1}^{dis}}{H_d^{dis} - H_{d-1}^{dis}} \cdot (i^{dis} - H_d^{dis}), \\[2mm] \quad \text{if } H_d^{dis} < i^{dis}, \text{ for } d = D \end{cases}$$

The obtained functions $\eta^C(i^{ch})$ and $\eta^D(i^{dis})$ above are continuous functions of any selected gross charging and net discharging measured currents $i^{ch}$, $i^{dis}$, as shown in FIGS. 2A and 2B. The relations can be now used for calculation of state-of-charge SOC vector for the time series t, $$SOC = (soc_0, soc_1, \dots, soc_{t-1}, soc_t, \dots).$$

It is possible to calculate each vector element value $soc_t$, at some time instant t, with respect to the previous $soc_{t-1}$ value which is known for the time interval Δt that occurred just before the time instant t, by using the definition:

$$soc_t = soc_{t-1} + \Delta t \cdot \hat{i}_t^{ch} - \Delta t \cdot \hat{i}_t^{dis} \quad \forall \, t \in \Omega^T$$

and by using the said relations $$\hat{i}_t^{ch} = \eta^C(i_t^{ch}) \text{ and } \hat{i}_t^{dis} = \eta^D(i_t^{dis}).$$

Example 2—Determination of Battery Charge Capacity $C^I$

The data obtained in Example 1 and the experimental determination of battery parameters, expressed in steps A-C, can be used hereby for determination (e.g., experimental determination) of the battery charge capacity $C^I$. For the mentioned task, the following steps D and E can be performed:

Step D

First, K number of different C-rates can be selected to perform K full charging-discharging cycles in the constant-current-constant-voltage mode. It may be desirable that K is greater than 1, for instance, for improving the method accuracy, but the procedure is possible to be carried out even for K=1. Provisions or conditions are set below:

(i) the selected C-rate can remain the same within the same cycle for charging and discharging, (ii) the cycle can be started with either fully depleted battery or fully charged battery, where fully depleted can mean that a battery is discharged until the discharge current drops below the defined low cut-off value, while keeping the battery's voltage at the low voltage limit, and fully charged can mean that a battery is charged until the charge current drops below the defined low cut-off value while keeping the battery's voltage at the high voltage limit, and (iii) each charging can be terminated when a battery is fully charged, while each discharging can be terminated when a battery is fully depleted, as defined in (ii).

Step E

For every full cycle performed in step D the logged currents $$i_t^{ch} \text{ and } i_t^{dis}$$

can be corrected with the results obtained in Example 1 by using charging $\eta^C$ and discharging $\eta^D$ efficiency characteristics, to obtain currents $$\hat{i}_t^{ch} \text{ and } \hat{i}_t^{dis}.$$

The values can be integrated in time to obtain K injected charges $$C_k^{batt,ch}$$

and K extracted charges $$C_k^{batt,dis}$$

from the battery, where the obtained charges can be averaged to calculate the newly defined, mean battery charge capacity:

$$C^I = \frac{\sum_{k=1}^K C_k^{batt,ch} + \sum_{k=1}^K C_k^{batt,dis}}{2 \cdot K}$$

Example 3—Determination of State of Health SOH Parameter

Results obtained in previous examples can be used for determination of state of health SOH parameter expressed in percentage 0-100%. Namely, SOH is a time-dependent parameter defined as $$SOH_t = C_t^I / C_0^I.$$

Parameter $$C_0^I$$

can correspond to the first determination of the mean battery charge capacity $C^I$ according to the Example 2 procedure when the battery is new, and $$C_t^I$$

can be a newly determined value $C^I$ during the battery usage period according to the same procedure.

Now, the Examples 1-3 teaching for the constant current (CC) mode can be simply rewritten for the constant power (CP) mode, offering the power/energy approach instead of the current/charge approach.

Example 4—Determination of State-of-Energy SOE Vector

If the battery cycling was performed in the CP mode, the obtained one-way efficiencies $$\eta_c^{ch} \text{ and } \eta_d^{dis}$$

can be used to determine the state-of-energy SOE vector. The procedure is explained in more detail below.

Previously calculated charging $$\eta_c^{ch}$$

and discharging $$\eta_d^{dis}$$

efficiencies in step C for the given battery can be used for defining piecewise linear efficiency characteristics $\eta^C$ and $\eta^D$ for the range of battery's operational charging/discharging P-rates.

The efficiency characteristics can be defined as:

$$\hat{p}^{ch} = \eta^C(p^{ch}) \text{ and } \hat{p}^{dis} = \eta^D(p^{dis}) \text{ where } \hat{p}^{ch}$$

is the net power injected in the battery during charging and it is function of gross power taken from an external source $p^{ch}$, while the gross power extracted from the battery during discharging $$\hat{p}^{dis}$$

is a function of net power delivered to an external sink $p^{dis}$.

The functions $\eta^C$ and $\eta^D$ can be obtained as the interpolations or extrapolations performed for measured powers $p^{ch}$, $p^{dis}$ values in respect to the known currents used in battery cycling in step A. Although different methods can be used for reconstruction of $\eta^C$ and $\eta^D$ as continuous functions, e.g., spline reconstruction or similar, the present disclosure will use a piecewise linear interpolation, which turns to be sufficiently accurate for the desired task.

To perform the desired tasks, some changes in notation can be applied to read the same regardless of the used mode, i.e., CC or CP mode. In the CP mode, $$H_c^{ch}$$

represents a selected c charging value $$p_c^{ch}$$

of P-rates from step A and G $$G_c^{ch}$$

its corrected value $$\hat{p}_c^{ch}$$

for the one-way charging efficiency $$\eta_c^{ch}$$

obtained from step C:

$$G_c^{ch} = \eta_c^{ch} \cdot H_c^{ch}, \ \forall \, c \in \Omega^C.$$

Similarly, $$H_d^{dis}$$

represents a selected d discharging value $$p_d^{dis}$$

of P-rates from step A and $$G_d^{dis}$$

its corrected value $$\hat{p}_d^{dis}$$

for the discharging efficiency $$\eta_d^{dis}$$

obtained in step C:

$$G_d^{dis} = \frac{H_d^{dis}}{\eta_d^{dis}}, \ \forall \, d \in \Omega^D.$$

Now, the interpolations and extrapolations read:

$$
\eta^C(p^{ch}) =
\begin{cases}
\dfrac{G_1^{ch}}{H_1^{ch}} \cdot p^{ch}, \text{ if } p^{ch} \le H_1^{ch} \\[2ex]
G_c^{ch} + \dfrac{G_{c+1}^{ch} - G_c^{ch}}{H_{c+1}^{ch} - H_c^{ch}} \cdot (p^{ch} - H_c^{ch}), \text{ if } H_c^{ch} < p^{ch} \le H_{c+1}^{ch}, \\[1ex]
\qquad \text{for } c = 1, 2 \ldots C - 1 \\[2ex]
G_c^{ch} + \dfrac{G_c^{ch} - G_{c-1}^{ch}}{H_c^{ch} - H_{c-1}^{ch}} \cdot (p^{ch} - H_c^{ch}), \\[1ex]
\qquad \text{if } H_c^{ch} < p^{ch}, \text{ for } c = C
\end{cases}
$$

and

-continued $$
\eta^D(p^{dis}) =
\begin{cases}
\dfrac{G_1^{dis}}{H_1^{dis}} \cdot p^{dis}, \text{ if } p^{dis} \le H_1^{dis} \\[2ex]
G_d^{dis} + \dfrac{G_{d+1}^{dis} - G_d^{dis}}{H_{d+1}^{dis} - H_d^{dis}} \cdot (p^{dis} - H_d^{dis}), \\[1ex]
\qquad \text{if } H_d^{dis} < p^{dis} \le H_{d+1}^{dis}, \text{ for } d = 1 \ldots D - 1 \\[2ex]
G_d^{dis} + \dfrac{G_d^{dis} - G_{d-1}^{dis}}{H_d^{dis} - H_{d-1}^{dis}} \cdot (p^{dis} - H_d^{dis}), \\[1ex]
\qquad \text{if } H_d^{dis} < p^{dis}, \text{ for } d = D
\end{cases}
$$

The obtained functions $\eta^C(p^{ch})$ and $\eta^D(p^{dis})$ above are continuous functions of any selected gross charging and net discharging measured powers $p^{ch}$, $p^{dis}$, as shown in FIGS. 2A and 2B. The relations can be now used for calculation of state-of-energy SOE vector for the time series t, $$SOE = (soe_0, soe_1, \ldots, soe_{t-1}, soe_t, \ldots).$$

It is possible to calculate each vector element value $soe_t$, at some time instant t, with respect to the previous $soe_{t-1}$ value which is known for the time interval $\Delta t$ that occurred just before the time instant t, by using the definition:

$$soe_t = soe_{t-1} + \Delta t \cdot \hat{p}_t^{ch} - \Delta t \cdot \hat{p}_t^{dis} \ \forall \, t \in \Omega^T$$

and by using the said relations $$\hat{p}_t^{ch} = \eta^C(p_t^{ch}) \text{ and } \hat{p}_t^{dis} = \eta^D(p_t^{dis}).$$

Example 5—Determination of Battery Energy Capacity $C^E$

The data obtained in Example 4 and the experimental determination of battery parameters, expressed in steps A-C, can be used hereby for determination (e.g., experimental determination) of the battery energy capacity $C^E$. For the mentioned task, the following steps D and E can be performed:

Step D

First, K number of different P-rates can be selected to perform K full charging-discharging cycles in the constant-power-constant-voltage mode. It may be desirable that K is greater than 1 for improving the method accuracy, but the procedure is possible to be carried out even for K=1. The provisions or conditions are set below:

(i) the selected P-rate can remain the same within the same cycle for charging and discharging, (ii) the cycle can be started with either a fully depleted battery or a fully charged battery, where fully depleted can mean that a battery is discharged until the discharge current drops below the defined low cut-off value, while keeping the battery's voltage at the low voltage limit, and fully charged can mean that a battery is charged until the charge current drops below the defined low cut-off value while keeping the battery's voltage at the high voltage limit, and (iii) each charging can be terminated when a battery is fully charged, while each discharging can be terminated when a battery is fully depleted, as defined in (ii).

Step E

For every full cycle performed in step D the logged powers $$p_r^{ch} \text{ and } p_t^{dis}$$

can be corrected with the results obtained in Example 4 by using charging $\eta^C$ and discharging $\eta^D$ efficiency characteristics, to obtain powers $$\hat{p}_r^{ch} \text{ and } \hat{p}_t^{dis}.$$

The values can be integrated in time to obtain K injected energies $$E_k^{batt,ch}$$

and K extracted energies $$E_k^{batt,dis},$$

where the obtained energies can be averaged to calculate the newly defined, mean battery energy capacity:

$$C^E = \frac{\sum_{k=1}^K E_k^{batt,ch} + \sum_{k=1}^K E_k^{batt,dis}}{2 \cdot K}$$

Example 6—Determination of State of Health SOH Parameter

Results obtained in previous examples 4 and 5 can be used for determination of the state of health SOH parameter expressed in percentage 0-100%. Namely, SOH is a time-dependent parameter defined as $$SOH_t = C_t^E / C_0^E.$$

Parameter $$C_0^E$$

can correspond to the first determination of the mean battery energy capacity $C^E$ according to the Example 5 procedure when the battery is new, and $$C_t^E$$

can be a newly determined value $C^E$ during the battery usage period according to the same procedure.

Example 7—an Hour Ahead Energy Charging Ability

Thera are many possible uses of the before mentioned data. As one example, an estimation of hour ahead energy charging ability for the instant SOE can be performed, when charging with a given P-rate. This approach can be frequently used to maximize profit by performing energy arbitrage. The battery storage can be a price taker and may not affect market prices, which are known or forecast in advance. The objective function of the proposed model can be:

$$\text{Maximize} \sum_{t \in \Omega^T} \lambda_t \cdot (p_t^{dis} - p_t^{ch}) \cdot \Delta t$$

where $\lambda_t$ are hourly market prices, $$p_t^{dis} \cdot \Delta t$$

is the energy sold in the market and $$p_t^{ch} \cdot \Delta t$$

is the energy purchased in the market for the selected time $\Delta t$. Example 4 connects the mentioned real-world values with the real battery values, previously calculated and modeled to read:

$$soe_t = soe_{t-1} + \Delta t \cdot \hat{p}_t^{ch} - \Delta t \cdot \hat{p}_r^{dis} \ \forall \ t \in \Omega^T$$

$$\hat{p}_t^{ch} = \eta^C(p_t^{ch}) \text{ and } \hat{p}_t^{dis} = \eta^D(p_t^{dis}).$$

It is noted that the maximization results can take the obtained efficiency characteristics $\eta^C$ and $\eta^D$ into account. Therefore, the optimization algorithm can suggest prolonging charging/discharging to non-peak energy price hours, for instance, if that results in a higher overall profit due to the reduced charging/discharging rates and consequently reduced energy losses. The model can also obey some constraints such as maximum charging/discharging P-rates the battery can sustain without being damaged. More complex models can include the battery amortisation, SOH calculations, and/or other relevant parameters to obtain the total costs of energy arbitrage performed with the modeled battery pack.

Example 8—Temperature Variations

FIGS. 2A and 2B represent one-way efficiency characteristics $\eta^C$ and $\eta^D$ determined for a given battery pack, for some constant environmental temperature $T^E$. The same figures show measured pairs denoted as the solid dots; in case of the CP mode $$\{p_t^{ch}, \hat{p}_t^{ch}\} \text{ and } \{p_t^{dis}, \hat{p}_t^{dis}\},$$

23 or in case of the CC mode $$\{i_t^{ch}, \bar{\imath}_t^{ch}\} \text{ and } \{i_t^{dis}, \bar{\imath}_t^{dis}\}.$$

Extrapolations and interpolations are denoted by the dashed and solid lines, while the "ideal battery" line is denoted by the dotted line where one-way efficiencies $$\eta_c^{ch} \text{ and } \eta_d^{dis}$$

are 1, i.e., the battery with 100% one-way efficiencies $$\eta_c^{ch} \text{ and } \eta_d^{dis}.$$

A change in environmental temperature $T^E$ can cause slight changes in one-way efficiencies $\eta^C$ and $\eta^D$ and can produce a family of curves that deviate from those presented in FIGS. 2A, 2B.

Experiments can be performed to obtain a family of curves $\eta^C$, $\eta^D$ which can be, inter alia, battery temperature $T^{Bat}$ dependent as any other electrochemical process, or simply environmental temperature $T^E$ depended.

In a straightforward manner, these findings can be applied, mutatis mutandis, to all examples previously discussed.

INDUSTRIAL APPLICABILITY

The present disclosure reveals a method for determination (e.g., experimental determination) of battery parameters and their use for SOE (State of Energy), SOC (State od Charge), and/or SOH (State of Health) calculations for a given battery. The present disclosure also discusses the subsequent use of the mentioned values in everyday battery practical applications.

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

The functionality of the elements disclosed herein may be implemented using circuitry or processing circuitry which includes general purpose processors, special purpose processors, integrated circuits, ASICs ("Application Specific Integrated Circuits"), conventional circuitry and/or combinations thereof which are configured or programmed to perform the disclosed functionality. Processors are considered processing circuitry or circuitry as they include transistors and other circuitry therein. The processor may be a programmed processor which executes a program stored in a memory. In the disclosure, the circuitry, units, or means are hardware that carry out or are programmed to perform the recited functionality. The hardware may be any hardware disclosed herein or otherwise known which is programmed or configured to carry out the recited functionality. When the hardware is a processor which may be considered a type of circuitry, the circuitry, means, or units are a combination of hardware and software, the software being used to configure the hardware and/or processor.

Further, as used herein, the term "circuitry" can refer to any or all of the following: (a) hardware-only circuit implementations (such as implementations in only analog and/or digital circuitry); (b) to combinations of circuits and software (and/or firmware), such as (as applicable): (i) a combination of processor(s) or (ii) portions of processor(s)/ software (including digital signal processor(s)), software and memory (ies) that work together to cause an apparatus, such as a mobile phone or server, to perform various functions); and (c) to circuits, such as a microprocessor(s) or a portion of a microprocessor(s), that require software or firmware for operation, even if the software or firmware is not physically present. This definition of "circuitry" can apply to all uses of this term in this application, including in any claims. As a further example, as used in this application, the term "circuitry" can also cover an implementation of merely a processor (or multiple processors) or portion of a processor and its (or their) accompanying software and/or firmware.

DEFINITIONS AND ABBREVIATIONS $T^E$—environmental temperature, $T^{Bat}$—measured battery temperature CC—constant current mode, CP—constant power mode, C—total number of different charging values used to conduct battery cycling for one-way efficiency determination purposes, (for CC denotes C-rate, for CP denotes P-rate), D—total number of different discharging values used to conduct battery cycling for one-way efficiency determination purposes, (for CC denotes C-rate, for CP denotes P-rate), J—cycling repetition number for one-way efficiency determination purposes, $$\Omega^C = \{c_1, c_2, \ldots, c_C\} - \text{set of selected } C \text{ values,}$$

$$\Omega^D = \{d_1, d_2, \ldots, d_D\} - \text{set of selected } D \text{ values,}$$

$$\eta_{c,d,j}^{cycle} - \text{measured roundtrip efficiency per cycle,}$$

$$\eta_{c,d}^{cycle} = \frac{\sum_{j=1}^{J} \eta_{c,d,j}^{cycle}}{J},$$

—averaged roundtrip battery efficiency over J repetitions, $$\eta_c^{ch} - \text{calculated (discrete) one-way charging efficiency}$$

$$\text{corresponding to } c \text{ charging } C-\text{rate (or } P-\text{rate)}$$

-continued $\eta_d^{dis}$ – calculated (discrete) one–way discharging efficiency corresponding to $d$ discharging C–rate (or P–rate), $$\eta_{c,d,j}^{cycle} = \frac{C_{c,d,j}^{dis}}{C_{c,d,j}^{ch}}$$

—roundtrip efficiency per cycle in CC mode, $C_{c,d,j}^{ch} = \int I_{c,d,j}^{ch}(t) \cdot dt$ – the injected charge into the battery, $C_{c,d,j}^{dis} = \int I_{c,d,j}^{dis}(t) \cdot dt$ – the extracted charge from the battery, $I_{c,d,j}^{ch}(t)$·–logged charging current, $I_{c,d,j}^{dis}(t)$·–logged discharging current, $$\eta_{c,d,j}^{cycle} = \frac{E_{c,d,j}^{dis}}{E_{c,d,j}^{ch}}$$

—roundtrip efficiency per cycle in CP mode, $E_{c,d,j}^{ch} = \int P_{c,d,j}^{ch}(t) \cdot dt$ – the injected power into the battery, $E_{c,d,j}^{dis} = \int P_{c,d,j}^{dis}(t) \cdot dt$ – the extracted power from the battery, $P_{c,d,j}^{ch}(t)$·– logged charging power, $P_{c,d,j}^{dis}(t)$·– logged discharging power, $\eta^C$—piecewise linear efficiency charging characteristic, $\eta^D$—piecewise linear efficiency discharging characteristic, In CC mode:

$\hat{i}^{ch} = \eta^C(i^{ch})$ – the current injected in the battery during charging, $i^{ch}$ – gross current taken from the external source, $\hat{i}^{dis} =$ $\eta^D(i^{dis})$ – gross current extracted from the battery during discharging, $i^{dis}$ – net current delivered to the external sink, In CP mode:

$\hat{p}^{ch} = \eta^C(p^{ch})$ – the power injected in the battery during charging, $p^{ch}$–gross power taken from the external source, $\hat{p}^{dis} =$ $\eta^D(p^{dis})$ – gross power extracted from the battery during discharging, $p^{dis}$ – net power delivered to the external sink, $G_c^{ch} = \eta_c^{ch} \cdot H_c^{ch}$; $c$ – charging value for selected C–rate or P–rate $H_c^{ch}$ – stands for $i_c^{ch}$ in CC mode, $G_c^{ch}$ – stands for $\hat{i}_c^{ch}$ in CC mode, $H_c^{ch}$ – stands for $p_c^{ch}$ in CP mode, $G_c^{ch}$ – stands for $\hat{p}_c^{ch}$ in CP mode, $G_d^{dis} = H_d^{dis}/\eta_d^{dis}$; $d$ – discharging value for selected C–rate or P–rate $H_d^{dis}$ – stands for $i_d^{dis}$ in CC mode, $G_d^{dis}$ – stands for $\hat{i}_d^{dis}$ in CC mode, $H_d^{dis}$ – stands for $p_d^{dis}$ in CP mode, $G_d^{dis}$ – stands for $\hat{p}_d^{dis}$ in CP mode, $SOC = (soc_0, soc_1, \ldots, soc_{t-1}, soc_t, \ldots)$ – state of charge vector, $soc_t = soc_{t-1} + \Delta t \cdot \hat{i}_r^{ch} - \Delta t \cdot \hat{i}_t^{dis}, \forall t \in \Omega^T,$ $SOE = (soe_0, soe_1, \ldots, soe_{t-1}, soe_t, \ldots)$ – state of energy vector, $soe_t = soe_{t-1} + \Delta t \cdot \hat{p}_r^{ch} - \Delta t \cdot \hat{p}_t^{dis}, \forall t \in \Omega^T,$ K—number of cycles with different C-rates (P-rates) for battery capacity determination purposes, $$C^I = \frac{\sum_{k=1}^{K} C_k^{batt,ch} + \sum_{k=1}^{K} C_k^{batt,dis}}{2 \cdot K}$$

—measured mean battery charge capacity, $$C^E = \frac{\sum_{k=1}^{K} E_k^{batt,ch} + \sum_{k=1}^{K} E_k^{batt,dis}}{2 \cdot K}$$

—measured mean battery charge capacity, $C_k^{batt,ch}$ – time integrated $\hat{i}_t^{ch}$ in $k$–th cycle, $C_k^{batt,dis}$ – time integrated $\hat{i}_t^{dis}$ in $k$–th cycle, $E_k^{batt,ch}$ – time integrated $\hat{p}_t^{ch}$ in $k$–th cycle, $E_k^{batt,dis}$ – time integrated $\hat{p}_t^{dis}$ in $k$–th cycle, $SOH_t = C_t^J/C_0^J$ – state of health in later time $t$, based on battery charge capacity change with time, $SOH_t = C_t^E/C_0^E$ – state of health in later time $t$, based on battery energy capacity change with time.

$\lambda_t$—hourly market prices

The invention claimed is:

1. A method for battery management for a battery of a modelled battery pack connected to a power grid, the method comprising:

determining, using processing circuitry of a battery management system, battery one-way efficiencies for the battery of the modelled battery pack and connected to the power grid for a given environmental temperature $T^E$ based on a selected one of a constant current (CC) mode or a constant power (CP) mode, wherein said determining the battery one-way efficiencies using the processing circuitry of the battery management system includes:

A. executing a battery cycling protocol where charging and discharging are respectively performed with an external bi-directional DC power supply operative as an external source or an external sink, in the selected constant current (CC) mode or the selected constant power (CP) mode;

where at least two C charging C-rates and at least two D discharging C-rates are implemented for the CC mode, where each said C-rate denotes a first measure of a first rate at which a battery charges or discharges under constant current relative to its declared charge capacity, or where at least two C charging P-rates and at least two D discharging P-rates are implemented for the CP mode, where each said P-rate denotes a second measure of a second rate at which the battery charges or discharges under constant power relative to its declared energy capacity, where a selected set of all $$\Omega^C = \{c_1, c_2, \ldots, c_C\} \text{ and } \Omega^D = \{d_1, d_2, \ldots, d_D\}$$

values forms C×D charge-discharge cycles for all possible {c,d} pairs of values, and where the battery cycling is repeated/times resulting in total of C×D×J charge-discharge cycles, with the provision that:

(i) each cycle is always started with a depleted battery as said battery, where depleted means that a non-depleted battery as said battery is discharged until the battery's low voltage limit has been reached with the provision that the discharging battery C-rate or P-rate is equal to the cycle's discharging C-rate or P-rate in step (iii), to ensure the same starting and finishing point of the cycle in terms of currents and voltages, (ii) each charging in the CC mode or the CP mode is terminated as soon as a declared battery high voltage limit is reached, (iii) each discharging in the CC mode or the CP mode is terminated as soon as a declared battery low voltage limit is reached, B. determining multiple roundtrip battery efficiencies $$\eta_{c,d}^{cycle}$$

for C×D different pairs of charging and discharging C-rates or P-rates defined in said step A, where for every performed cycle the roundtrip efficiency per cycle $$\eta_{c,d,j}^{cycle},$$

for selected c, a and j, is calculated:

in a first case of the selected CC mode, from the extracted charge $$\eta_{c,d,j}^{dis}$$

and the injected charge $$C_{c,d,j}^{ch}$$

into said bauery:

$$\eta_{c,d,j}^{cycle} = \frac{C_{c,d,j}^{dis}}{C_{c,d,j}^{ch}}$$

where the charges $$C_{c,d,j}^{ch} \text{ and } C_{c,d,j}^{dis}$$

are obtained by numerical integration of the time-dependent charging current $$I_{c,d,j}^{ch}(t)$$

and the discharging current $$I_{c,d,j}^{dis}(t): \quad C_{c,d,j}^{ch} = \int I_{c,d,j}^{ch}(t) \cdot dt$$

$$C_{c,d,j}^{dis} = \int I_{c,d,j}^{dis}(t) \cdot dt$$

where the currents $$I_{c,d,j}^{ch}(t) \text{ and } I_{c,d,j}^{dis}(t)$$

are logged during every cycle, or in a second case of the selcted CP mode, from the extracted energy $$E_{c,d,j}^{dis}$$

and the injected energy $$E^{ch}_{c,d,j}$$

into the said battery:

$$\eta^{cycle}_{c,d,j} = \frac{E^{dis}_{c,d,j}}{E^{ch}_{c,d,j}}$$

where the energies $$E^{ch}_{c,d,j} \text{ and } E^{dis}_{c,d,j}$$

are obtained by numerical intergration of the time-dependent charing power $$P^{ch}_{c,d,j}(t)$$

and the discharging power $$P^{dis}_{c,d,j}(t): \quad E^{ch}_{c,d,j} = \int P^{ch}_{c,d,j}(t) \cdot dt$$

$$E^{dis}_{c,d,j} = \int P^{dis}_{c,d,j}(t) \cdot dt$$

where the powers $$P^{ch}_{c,d,j}(t) \text{ and } P^{dis}_{c,d,j}(t)$$

are logged during every cycle, and where the obtained roundtrip efficiencies per cycle $$\eta^{cycle}_{c,d,j}$$

are averaged oy the number of repetitions/from said step A, yielding the roundtrip battery emiciencies $$\eta^{cycle}_{c,d,j}$$

for selected C and D values to read:

$$\eta^{cycle}_{c,d} = \frac{\sum_{j=1}^{J} \eta^{cycle}_{c,d,j}}{J}$$

C. determining the one-way efficiencies from the calculated roundtrip battery efficiencies $$\eta^{cycle}_{c,d}$$

in said step B, where $$\eta^{ch}_c \text{ and } \eta^{dis}_d$$

denote one-way charging and discharging efficiencies, respectively, by solving the nonlinear optimization problem which contains C+D unknowns and C×D equations:

$$\text{Minimize} \sum_{c \in \Omega^C} \sum_{d \in \Omega^D} s^2_{c,d}$$

subjected to the following constrains:

$$\eta^{ch}_c \cdot \eta^{dis}_d = \eta^{cycle}_{c,d} + s_{c,d} \quad \forall \, c \in \Omega^C, d \in \Omega^D$$

$$0 \le \eta^{ch}_c \le 1, \forall \, c \in \Omega^C$$

$$0 \le \eta^{dis}_d \le 1, \forall \, d \in \Omega^D$$

wherein $S_{c,d}$ is a slack variable, and where the solution of the nonlinear optimization problem gives $$\eta^{ch}_c \text{ and } \eta^{dis}_d,$$

multiplication of which diverges from the measured efficiency $$\eta^{cycle}_{c,d}$$

the least for every selected {c,d} pair of values; and
controlling, using the processing circuitry of the battery management system, selective charging and discharging of the battery of the modelled battery pack relative to the power grid based on the determined battery one-way efficiencies for a current environmental temperature of the battery of the modelled battery pack relative to the given environmental temperature $T^E$, toward balancing the power grid relative to the battery of the modelled battery pack.

2. The method according to claim 1, wherein, in the CC mode for determination of a state-of-charge SOC vector, the following steps are performed:

D. calculating charging $$\eta^{ch}_c$$

and discharging $$\eta^{dis}_d$$

efficiencies in said step C for the battery are used for defining piecewise linear efficiency characteristics $n^C$ and $n^D$ for the range of battery's operational charging/discharging C-rates, where the efficiency characteristics are defined as:

$$\hat{i}^{ch} = \eta^C(i^{ch}) \text{ and } \hat{i}^{dis} = \eta^D(i^{dis})$$

where $$\hat{i}^{ch}$$

is a net current meciea m me oauery during charging and a function of gross current taken from the external source $i^{ch}$, while gross current extracted from the battery during discharging $$\hat{i}^{dis}$$

is a runcuon ot le ue curren delivered to the external sink $i^{dis}$ as said external source/sink, E. where the functions $\eta^C$ and $\eta^D$ are obtained as interpolations or extrapolations performed for actual currents $i^{ch}$, $i^{dis}$ values in respect to known currents used in the battery cycling in said step A, a linear interpolation, where $$H_c^{ch}$$

represents a selected c charging value of C-rates from said step A and $$G_c^{ch}$$

its corrected value for the one-way charging efficiency $$\eta_c^{ch}$$

obtained in sala step C:

$$G_c^{ch} = \eta_c^{ch} \cdot H_c^{ch}, \forall c \in \Omega^C,$$

where $$H_d^{dis}$$

represents a selected d discharging value of C-rates from said step A and $$G_d^{dis}$$

its corrected value for the discharging efficiency $$\eta_d^{dis}$$

obtained in said step C:

$$G_d^{dis} = \frac{H_d^{dis}}{\eta_d^{dis}}, \forall d \in \Omega^D$$

where the interpolations and extrapolations read:

$$\eta^C(i^{ch}) = \begin{cases} \frac{G_1^{ch}}{H_1^{ch}} \cdot i^{ch}, \text{ if } i^{ch} \le H_1^{ch} \\ G_c^{ch} + \frac{G_{c+1}^{ch} - G_c^{ch}}{H_{c+1}^{ch} - H_c^{ch}} \cdot (i^{ch} - H_c^{ch}), \text{ if } H_c^{ch} < i^{ch} \le H_{c+1}^{ch}, \\ \qquad\qquad \text{for } c = 1, 2 \ldots C - 1 \\ G_c^{ch} + \frac{G_c^{ch} - G_{c-1}^{ch}}{H_c^{ch} - H_{c-1}^{ch}} \cdot (i^{ch} - H_c^{ch}), \text{ if } H_c^{ch} < i^{ch}, \text{ for } c = C \end{cases}$$

and $$\eta^D(i^{dis}) = \begin{cases} \frac{G_1^{dis}}{H_1^{dis}} \cdot i^{dis}, \text{ if } i^{dis} \le H_1^{dis} \\ G_d^{dis} + \frac{G_{d+1}^{dis} - G_d^{dis}}{H_{d+1}^{dis} - H_d^{ch}} \cdot (i^{dis} - H_d^{dis}), \text{ if } H_d^{dis} < i^{dis} \le H_{d+1}^{dis}, \\ \qquad\qquad \text{for } d = 1 \ldots D - 1 \\ G_d^{dis} + \frac{G_d^{dis} - G_{d-1}^{dis}}{H_d^{dis} - H_{d-1}^{dis}} \cdot (i^{dis} - H_d^{dis}), \text{ if } H_d^{dis} < i^{dis}, \text{ for } d = D \end{cases}$$

F. where the obtained $\eta^C(i^{ch})$ and $\eta^D(i^{dis})$, for any of the selected gross charging and net discharging measured currents $i^{ch}$, $i^{dis}$, are used for calculation of the state-of-charge SOC vector for a time series t, $$SOC = (soc_0, soc_1, \ldots, soc_{t-1}, soc_t, \ldots)$$

where each vector element $soc_t$ at some time instant t is calculated in respect to the previous $soc_{t-1}$ value known for the time interval $\Delta t$ that occurred just before time instant t starting from the definition:

$$soc_t = soc_{t-1} + \Delta t \cdot \hat{i}_t^{ch} - \Delta t \cdot \hat{i}_t^{dis} \quad \forall t \in \Omega^T$$

by using the relations $$\hat{i}_t^{ch} = \eta^C(i_t^{ch}) \text{ and } \hat{i}_t^{dis} = \eta^D(i_t^{dis}).$$

3. The method according to claim 2, wherein, in the CC mode, for determination of battery charge capacity $C^I$, the following steps are performed:

G. selecting K number of different C-rates to perform K full charging-discharging cycles in a constant-current (CC)-constant-voltage (CV) mode, with the provisions that:

(i) the selected C-rate remains the same within the same cycle for charging and discharging, (ii) the cycle is started with either a fully depleted battery or a fully charged battery as said battery, where fully depleted means that the battery is discharged until the discharge current drops below a defined low cut-off value, while keeping the battery's voltage at the low voltage limit, and fully charged means that the battery is charged until the charge current drops below the defined low cut-off value while keeping the battery's voltage at the high voltage limit, and (iii) each said charging is terminated when the battery is fully charged, while each discharging is terminated when the battery is fully depleted, as defined in (ii), and H. for every full cycle performed in said step G, the logged currents $$i_t^{ch} \text{ and } i_t^{dis}$$

are corrected with the results obtained in said step E by using charging $\eta^C$ and discharging $\eta^D$ efficiency characteristics, to obtain currents $$\hat{i}_t^{ch} \text{ and } \hat{i}_t^{dis},$$

which are integrated in time to obtain K injected charges $$C_k^{batt,ch}$$

and K extracted charges $$C_k^{batt,dis}$$

where the obtained charges are averaged to calculate the battery charge capacity:

$$C^I = \frac{\sum_{k=1}^{K} C_k^{batt,ch} + \sum_{k=1}^{K} C_k^{batt,dis}}{2 \cdot K}.$$

4. The method according to claim 1, wherein, in the CP mode for determination of the state-of-energy SOE vector, the following steps are performed:

D. calculating charging $$\eta_c^{ch}$$

and discharging $$\eta_d^{dis}$$

--- efficiencies in said step C for the battery are used for defining piecewise linear efficiency characteristics $\eta_C$ and $\eta^D$ for the range of battery's operational charging/discharging P-rates, where the efficiency characteristics are defined as:

$$\hat{p}^{ch} = \eta^C(p^{ch}) \text{ and } \hat{p}^{dis} = \eta^D(p^{dis})$$

where $$\hat{p}^{c/t}$$

is a net power injected in the battery during charging and a function of gross power taken from the external source $p^{ch}$, while the gross power extracted from the battery during discharging $$\hat{p}^{dis}$$

is a function of net power delivered to an external sink $p^{dis}$ as said external source/sink, E. where the functions $\eta^C$ and $\eta^D$ are obtained as interpolations or extrapolations performed for actual powers $p^{ch}$, $p^{dis}$ values in respect to known powers used in battery cycling in said step A, a linear interpolation, where $$H_c^{ch}$$

represents a selected c charging value of P-rates from said step A and $$G_c^{ch}$$

its corrected value for the one-way charging efficiency $$\eta_c^{ch}$$

obtained from said step C:

$$G_c^{ch} = \eta_c^{ch} \cdot H_c^{ch}, \forall c \in \Omega^C,$$

where $$H_d^{dis}$$

represents a selected d discharging value of P-rates from said step A and $$G_d^{dis}$$

its corrected value for the discharging efficiency $$\eta_d^{dis}$$

obtained in said step C:

$$G_d^{dis} = \frac{H_d^{dis}}{\eta_d^{dis}}, \; \forall \, d \in \Omega^D$$

where the interpolations and extrapolations read:

$$\eta^C(p^{ch}) = \begin{cases} \dfrac{G_1^{ch}}{H_1^{ch}} \cdot p^{ch}, \text{ if } p^{ch} \le H_1^{ch} \\ G_c^{ch} + \dfrac{G_{c+1}^{ch} - G_c^{ch}}{H_{c+1}^{ch} - H_c^{ch}} \cdot (p^{ch} - H_c^{ch}), \text{ if } H_c^{ch} < p^{ch} \le H_{c+1}^{ch}, \\ \qquad\qquad\qquad \text{for } c = 1, 2 \ldots C-1 \\ G_c^{ch} + \dfrac{G_c^{ch} - G_{c-1}^{ch}}{H_c^{ch} - H_{c-1}^{ch}} \cdot (p^{ch} - H_c^{ch}), \text{ if } H_c^{ch} < p^{ch}, \text{ for } c = C \end{cases}$$

and $$\eta^D(p^{dis}) = \begin{cases} \dfrac{G_1^{dis}}{H_1^{dis}} \cdot p^{dis}, \text{ if } p^{dis} \le H_1^{dis} \\ G_d^{dis} + \dfrac{G_{d+1}^{dis} - G_d^{dis}}{H_{d+1}^{dis} - H_d^{dis}} \cdot (p^{dis} - H_d^{dis}), \text{ if } H_d^{dis} < p^{dis} \le H_{d+1}^{dis}, \\ \qquad\qquad\qquad \text{for } d = 1 \ldots D-1 \\ G_d^{dis} + \dfrac{G_d^{dis} - G_{d-1}^{dis}}{H_d^{dis} - H_{d-1}^{dis}} \cdot (p^{dis} - H_d^{dis}), \text{ if } H_d^{dis} < p^{dis}, \text{ for } d = D \end{cases}$$

F. where the obtained $\eta^C(p^{ch})$ and $\eta^D(p^{dis})$, for any of the selected gross charging and net discharging measured powers $p^{ch}$, $p^{dis}$, are used for calculation of a state-of-energy SOE vector for a time series t, $$SOE = (soe_0, soe_1, \ldots, soe_{t-1}, soe_t, \ldots)$$

where each vector element $soe_t$ at some time instant t is calculated in respect to the previous $soe_{t-1}$ value known for the time interval $\Delta t$ that occurred just before time instant t starting from the definition:

$$soe_t = soe_{t-1} + \Delta t \cdot \hat{p}_t^{ch} - \Delta t \cdot \hat{p}_t^{dis} \quad \forall \, t \in \Omega^T$$

by using the relations $$\hat{p}_t^{ch} = \eta^C(p_t^{ch}) \text{ and } \hat{p}_t^{dis} = \eta^D(p_t^{dis}).$$

5. The method according to claim 4, wherein, in the CP mode, for determination of battery energy capacity $C^E$, the following steps are performed:

G. selecting K number of different P-rates to perform K full charging-discharging cycles in a constant-power (CP)-constant-voltage (CV) mode, with the provisions that:

(i) the selected P-rate remains the same within the same cycle for charging and discharging, (ii) a cycle is started with either a fully depleted battery or a fully charged battery as said battery, where fully depleted means that the battery is discharged until the discharge current drops below the defined low cut-off value, while keeping the battery's voltage at the low voltage limit, and fully charged means that the battery is charged until the charge current drops below the defined low cut-off value while keeping the battery's voltage at the high voltage limit, and (iii) each charging is terminated when the battery is fully charged, while each discharging is terminated when the battery is fully depleted, as defined in (ii), and H. for every full cycle performed in said step G the logged powers $$p_t^{ch} \text{ and } p_t^{dis}$$

are corrected with the results obtained in said step E by using charging $\eta_C$ and discharging $\eta_D$ efficiency characteristics, to obtain powers $$\hat{p}_t^{ch} \text{ and } \hat{p}_t^{dis},$$

which are integrated in time to obtain K injected energies $$E_k^{batt,ch}$$

and K extracted energies $$E_k^{batt,dis},$$

where the obtained energies are averaged to calculate the battery energy capacity:

$$C^E = \frac{\sum_{k=1}^{K} E_k^{batt,ch} + \sum_{k=1}^{K} E_k^{batt,dis}}{2 \cdot K}.$$

6. The method according to claim 4, wherein the processing circuitry of the battery management system is configured to use the SOE vector for the time series t to estimate an hour ahead energy charging ability for an instant SOE, under a condition of charging with a given P-rate during said controlling the selective charging and discharging of the battery of the modelled battery pack relative to the power grid based on the determined battery one-way efficiencies for the given environmental temperature $T^E$ toward balancing the power grid relative to the battery of the modelled battery pack.

7. The method according to claim 3, wherein, for determination of a state of health SOH parameter expressed in percentage 0-100%, where SOH parameter in time is defined as $$SOH_t = C_t^J / C_0^J,$$

and where $$C_0^I$$

corresponas with a first determination of mean battery charge capacity $C^I$ performed when the battery is new, and $$C_t^I$$

is a newly determined value $C^I$ during a battery usage period.

8. The method according to claim 5, wherein, for determination of a state of health SOH parameter expressed in percentage 0-100%, where SOH parameter in time is defined as $$SOH_t = C_t^E / C_0^E,$$

and where $$C_0^E$$

corresponds with a first determination of mean battery energy capacity $C^E$ performed when the battery is new, and $$C_t^E$$

is a newly determined value $C^E$ during the battery usage period.

9. The method according to claim 1, wherein the method is performed for different given environmental temperatures $T^E$, including said environmental temperature $T^E$, resulting in temperature dependent family of $$\eta_c^{ch} \text{ and } \eta_d^{dis}$$

data points.

10. The method according to claim 1, wherein for said controlling in terms of selective charging and discharging of the battery of the modelled battery pack relative to the power grid the processing circuitry of the battery management system controls charging and discharging rates according to operational charging rates for the battery of the modelled battery pack.

11. The method according to claim 1, wherein the charge and/or discharge from the battery of the modelled battery pack for said controlling in terms of selective charging and discharging of the battery of the modelled battery pack relative to the power grid is sent to and from a renewable power processor different from said processing circuitry of the battery management system.

12. The method according to claim 1, wherein said controlling in terms of selective charging and discharging of the battery of the modelled battery pack relative to the power grid is based on determining whether power from a renewable power source connected to the power grid is unavailable for charging and switching to operations of selectively outputting energy from or receiving energy to the battery of the modelled battery pack.

\* \* \* \* \*